(12) United States Patent
Kobayashi et al.

(10) Patent No.: US 7,572,717 B2
(45) Date of Patent: Aug. 11, 2009

(54) METHOD OF MANUFACTURING SEMICONDUCTOR DEVICE

(75) Inventors: Takayo Kobayashi, Yokohama (JP); Kentaro Imamizu, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 285 days.

(21) Appl. No.: 11/495,623

(22) Filed: Jul. 31, 2006

(65) Prior Publication Data

US 2007/0059924 A1   Mar. 15, 2007

(30) Foreign Application Priority Data

Sep. 14, 2005   (JP) ............................ P2005-267011

(51) Int. Cl.
*H01L 21/20* (2006.01)
(52) U.S. Cl. ............... 438/584; 438/672; 257/E21.579; 257/E21.585
(58) Field of Classification Search ......... 438/584–638, 438/672, 675, 761; 257/E21.579, 761, E21.583, 257/E21.584, E21.585, E21.586, E21.588
See application file for complete search history.

(56) References Cited

U.S. PATENT DOCUMENTS

| | | | |
|---|---|---|---|
| 6,943,111 B2 * | 9/2005 | Lin et al. ................ | 438/687 |
| 6,953,745 B2 | 10/2005 | Ahn et al. | |
| 2004/0207085 A1 | 10/2004 | Fujii et al. | |
| 2005/0272258 A1 | 12/2005 | Morita et al. | |
| 2006/0068600 A1 * | 3/2006 | Toyoda et al. ............... | 438/761 |

FOREIGN PATENT DOCUMENTS

| CN | 1581476 A | 2/2005 |
|---|---|---|
| JP | 2002-299343 | 10/2002 |
| JP | 2005-57277 | 3/2005 |

* cited by examiner

*Primary Examiner*—Khiem D Nguyen
(74) *Attorney, Agent, or Firm*—Finnegan, Henderson, Farabow, Garrett & Dunner, L.L.P.

(57) ABSTRACT

According to an aspect of the present invention, there is provided a method of manufacturing a semiconductor device, the method including forming on a semiconductor substrate an insulating film having a recessed portion in a surface thereof, forming on the insulating film a first metal film so as to fill up the recessed portion, forming on the first metal film a second metal film having lower vacancy density than that of the first metal film, forming on the second metal film a compression stress applying film which applies compression stress to the first metal film through the second metal film when heat treatment is applied, performing heat treatment on the first metal film, the second metal film and the compression stress applying film, and removing the second metal film and the first metal film except a portion thereof filling up the recessed portion to thereby form a wiring in the recessed portion.

13 Claims, 5 Drawing Sheets

METHOD OF MANUFACTURING SEMICONDUCTOR DEVICE

CROSS-REFERENCE TO RELATED APPLICATIONS

This application is based upon and claims the benefit of priority from the prior Japanese Patent Application No. 2005-267011, filed on Sep. 14, 2005; the entire contents of which are incorporated herein by reference.

BACKGROUND

1. Field of the Invention

The present invention relates to a method of manufacturing a semiconductor device.

2. Description of the Related Art

In recent years, as a material of wiring of a semiconductor device, Cu is used instead of Al in order to decrease wiring resistance and to improve resistance to migration such as electromigration (EM) and stress migration (SM) which can cause defect in wiring.

Unlike AL, Cu is difficult to process by RIE (reactive ion etching), and thus a damascene method is used for forming wiring with Cu, in which a wiring trench and a via hole are formed in a surface of an insulating film in advance, a Cu film is formed on the insulating film so as to fill up the wiring trench and the via hole with Cu, and thereafter an unnecessary portion of the Cu film is removed by chemical mechanical polishing to thereby form the wiring.

As a method of forming a Cu film in the damascene method, electrolytic plating method is widely used. Since formation of a Cu film by this electrolytic plating method is carried out approximately at room temperature, growth of crystal of Cu constituting the Cu film occurs when heat treatment is performed after the Cu film is formed.

However, in the Cu film formed by electrolytic plating method, large amounts of vacancies and impurities exist. Accordingly, when heat treatment is performed in this state, the Cu film shrinks and the vacancies in the Cu film agglomerate at a crystal grain boundary, which may cause formation of a void. When this void is formed in a wiring trench or a via hole, it exists as an initial void in a Cu wiring.

Further, with a large amount of vacancies existing in a Cu wiring, when heat stress is applied thereto for a long period of time, the vacancies agglomerate at a location where the stress concentrates, such as immediately under a via plug to thereby form a void, which causes Stress Induced Voiding (SIV) that is a problem in reliability of wiring.

Incidentally, techniques to form a void diffusion preventing film on a metal wiring film have been disclosed. Here, the void diffusion preventing film is for restricting movement of a void existing in a metal wiring film formed on the void diffusion preventing film to a metal wiring film under the void diffusion preventing film (for example, refer to Japanese Patent Application Laid-open No. 2005-57277).

SUMMARY

According to an aspect of the present invention, there is provided a method of manufacturing a semiconductor device, the method including forming on a semiconductor substrate an insulating film having a recessed portion in a surface thereof, forming on the insulating film a first metal film so as to fill up the recessed portion, forming on the first metal film a second metal film having lower vacancy density than that of the first metal film, forming on the second metal film a compression stress applying film which applies compression stress to the first metal film through the second metal film when heat treatment is applied, performing heat treatment on the first metal film, the second metal film and the compression stress applying film, and removing the second metal film and the first metal film except a portion thereof filling up the recessed portion to thereby form a wiring in the recessed portion.

DETAILED DESCRIPTION

Figure 1:
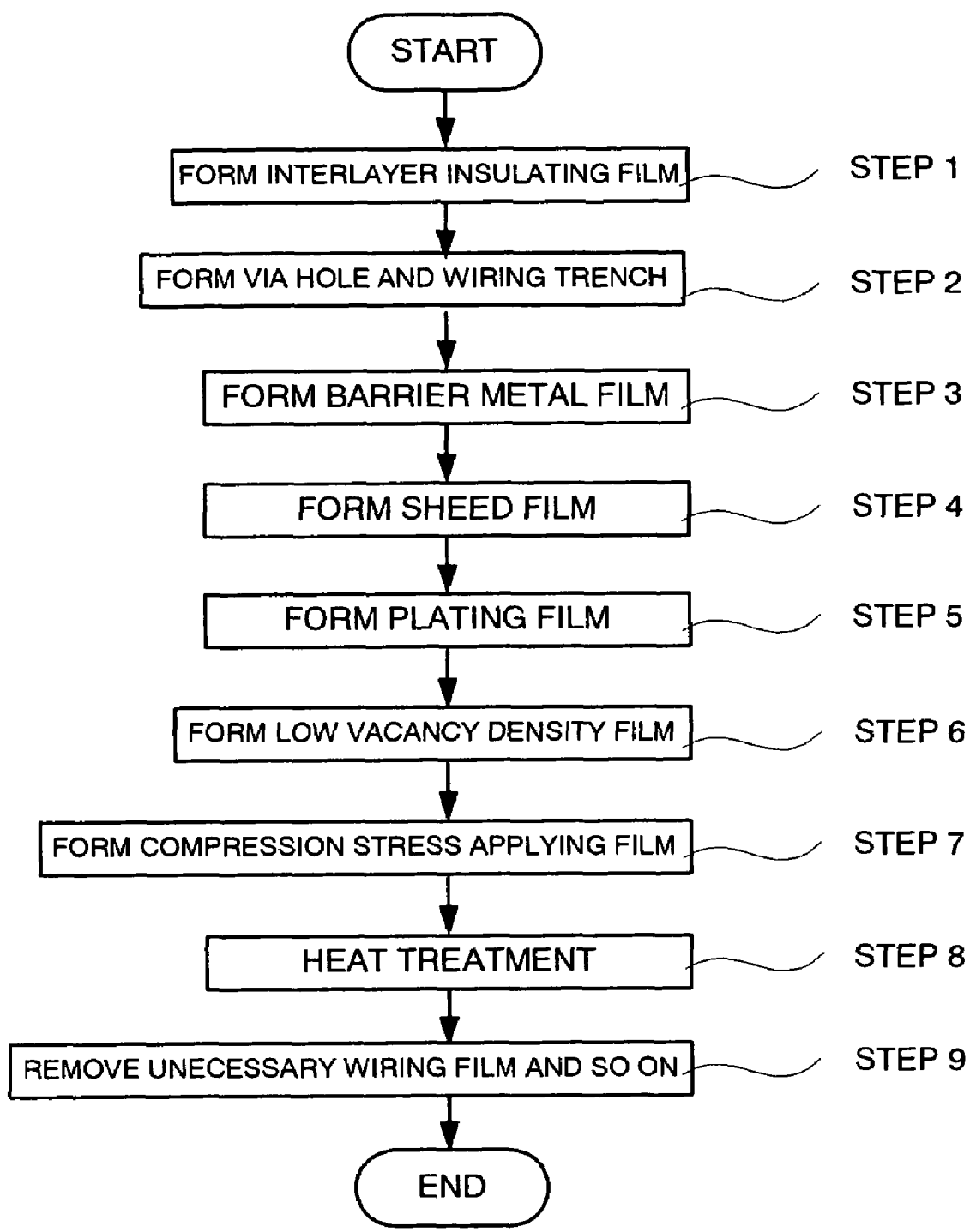
FIG. 1 is a flow chart showing a flow of a manufacturing process of a semiconductor device according to an embodiment.
Figure 3:
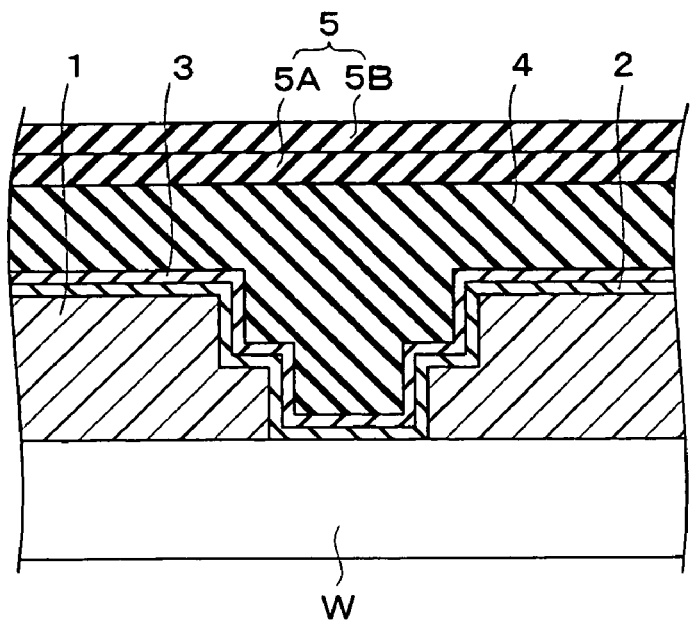
FIG. 3 is a schematic manufacturing process view of another semiconductor device according to the embodiment.
Figure 4:
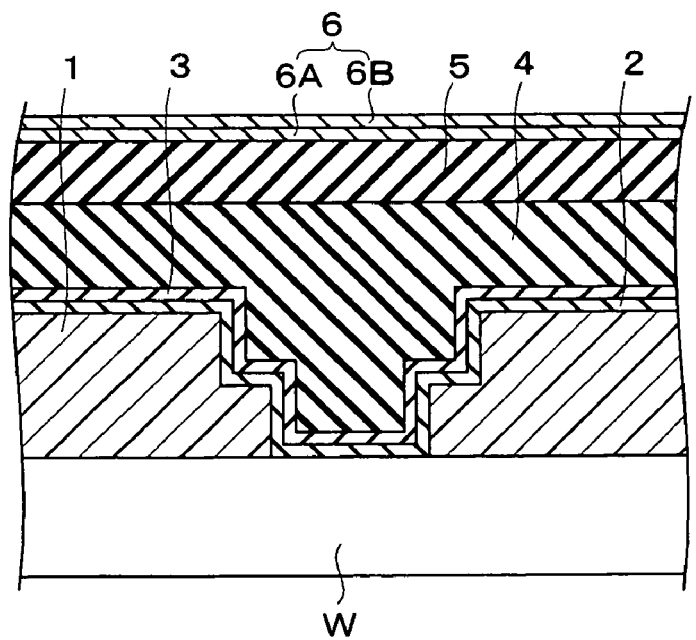
FIG. 4 is a schematic manufacturing process view of another semiconductor device according to the embodiment.

Hereinafter, an embodiment of the present invention will be described with reference to the drawings. In the drawings below, the same reference numerals are designated to the same members. FIG. 1 is a flow chart showing a flow of a manufacturing process of a semiconductor device according to this embodiment, FIG. 2A to FIG. 2I are schematic manufacturing process views of the semiconductor device according to this embodiment, and FIG. 3 and FIG. 4 are schematic manufacturing process views of another semiconductor device according to this embodiment.

Figure 2A:
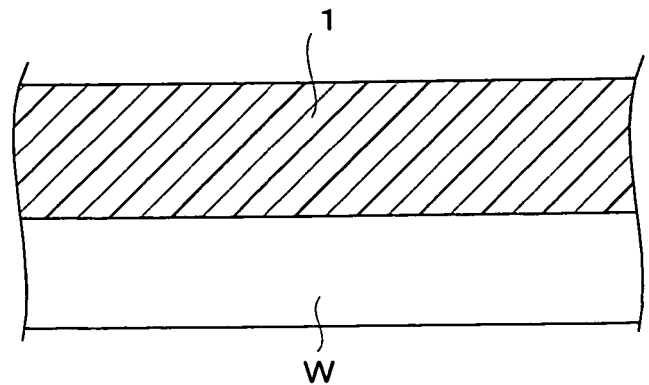
FIG. 2A to FIG. 2I are schematic manufacturing process views of the semiconductor device according to the embodiment.

As shown in FIG. 1 and FIG. 2A, on a semiconductor wafer W (hereinafter, simply referred to as a wafer) on which not-shown semiconductor elements and the like are formed, an interlayer insulating film 1 is formed by Chemical Vapor Deposition (CVD) method or coating method (Step 1) for example. The interlayer insulating film 1 may be, for example, a low dielectric insulating film (low-k film), an $SiO_2$ film, or the like. The low dielectric insulating film may be, for example, an organic Si oxide film, an organic resin film, a porous Si oxide film, or the like.

Figure 2B:
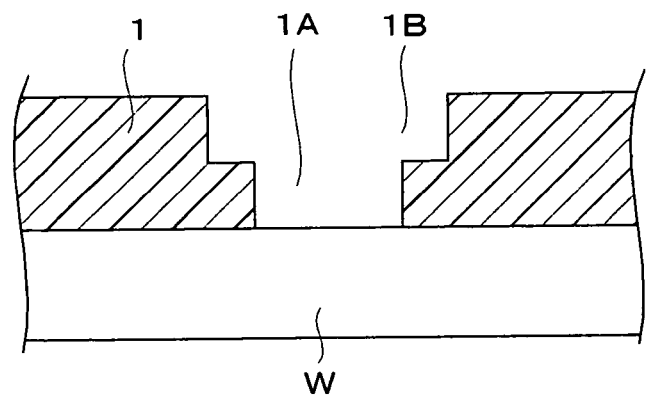

After the interlayer insulating film 1 is formed, as shown in FIG. 2B, a via hole 1A as a recessed portion and a wiring trench 1B as a recessed portion are formed by photolithography and reactive ion etching (RIE) in the interlayer insulating film 1 (Step 2). In this embodiment, both the via hole 1A and the wiring trench 1B are formed in the interlayer insulating film 1, but it should be noted that only the via hole 1A or the wiring trench 1B may be formed in the interlayer insulating film 1.

To form the via hole 1A and the wiring trench 1B, first a resist pattern is formed on the interlayer insulating film 1, and thereafter, with this resist pattern being a mask, the interlayer insulating film 1 is etched by RIE so as to form the via hole 1A in the interlayer insulating film 1. After the via hole 1A is formed in the interlayer insulating film 1, the resist pattern is removed by ashing or the like. Thereafter, the wiring trench 1B is formed with the same procedure. Note that it is also possible to form the via hole 1A after the wiring trench 1B is formed with the same procedure.

Figure 2C:
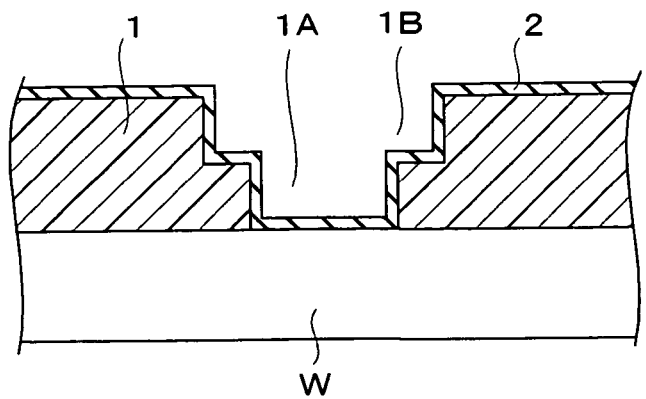

After the via hole 1A and the wiring trench 1B are formed in the interlayer insulating film 1, a barrier metal film 2 for suppressing diffusion of metal into the interlayer insulating film 1 is formed on the interlayer insulating film 1 by Physical Vapor Deposition (PVD) method such as sputtering method and deposition method or CVD method for example as shown in FIG. 2C (Step 3). A material constituting the barrier metal film 2 may be, for example, a conductive material such as Ta, Ti, TaN, TiN, NbN, WN, or VN. Note that the barrier metal film 2 may be formed with layers of these materials.

Figure 2D:
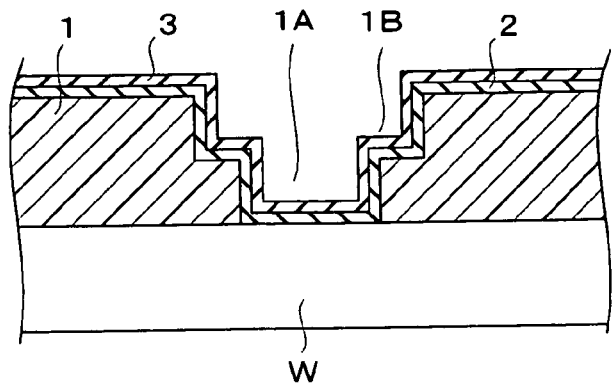

After the barrier metal film 2 is formed, as shown in FIG. 2D, on the barrier metal film 2, a seed film 3 is formed for allowing flow of current during electrolytic plating by PVD method for example (Step 4). A material constituting the seed film 3 may be, for example, metal such as Cu, Ru, Ag, or Au.

Figure 2E:
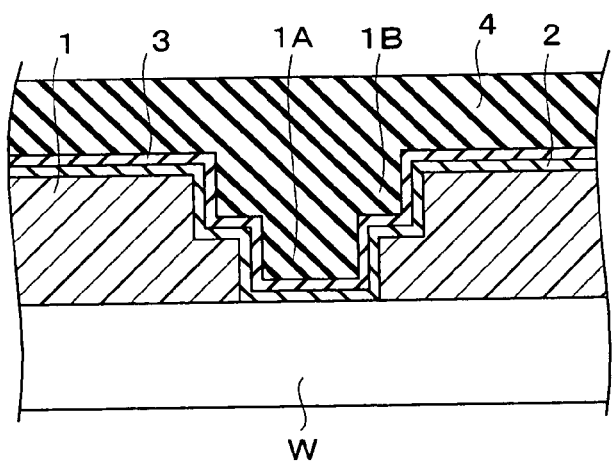

After the seed film 3 is formed, as shown in FIG. 2E, on the seed film 3, a plating film 4 as a first metal film is formed by electrolytic plating method for example (Step 5). The plating film 4 is constituted of, for example, metal such as Cu, Ag, or Au. The plating film 4 is formed so as to fill up the whole of the via hole 1A and the wiring trench 1B. Note that in the plating film 4, an impurity may be mixed besides the metal constituting the plating film 4.

Figure 2F:
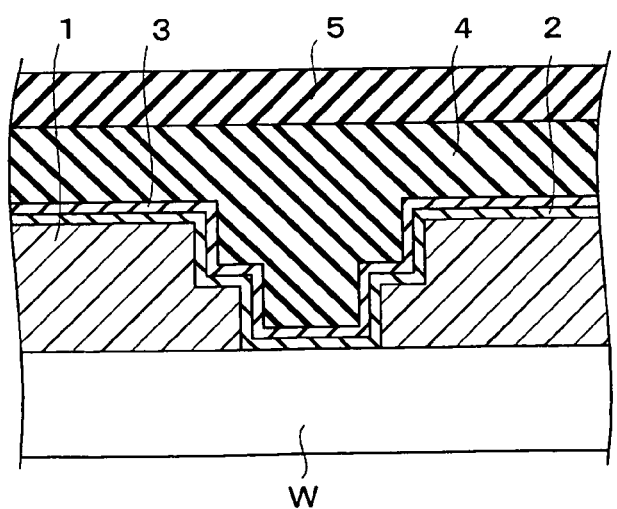

After the plating film 4 is formed, as shown in FIG. 2F, on the plating film 4, a low vacancy density film 5 as a second metal film having a lower vacancy density than that of the plating film 4 is formed by PVD method, electrolytic plating method, electroless plating method or the like for example (Step 6). Note that in the case that the low vacancy density film 5 is formed by PVD method, the film becomes denser than that formed by electrolytic plating method or the like, and thus a film with lower vacancy density is formed. Therefore, it is preferable to form the low vacancy density film 5 by PVD method.

The low vacancy density film 5 may be a film with lower vacancy density than that of the plating film 4. The low vacancy density film 5 is constituted of metal, which is preferred to be the same metal as one constituting the plating film 4 so as to suppress increase of wiring resistance of a wiring 8 which will be described later. Specifically, when the plating film 4 is constituted of Cu for example, it is preferable to form the low vacancy density film 5 with Cu. Note that it is not mandatory to form the low vacancy density film 5 with the same metal as one constituting the plating film 4.

The low vacancy density film 5 may be a single layer, but it may also be of layered structure constituted of a first film 5A, a second film 5B, and so on as shown in FIG. 3. Here, when the low vacancy density film 5 is of layered structure, it is satisfactory if the entire low vacancy density film 5 has vacancy density which is lower than that of the plating film 4, and thus films constituting the low vacancy density film 5 may include a film having larger vacancy density than that of the plating film 4.

Figure 2G:
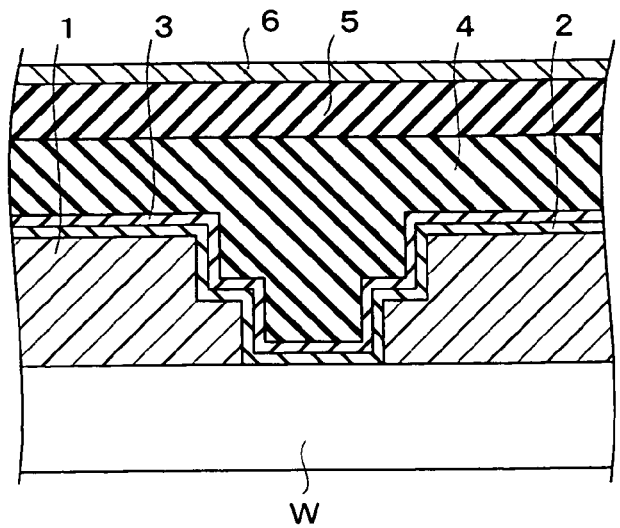

After the low vacancy density film 5 is formed, as shown in FIG. 2G, on the low vacancy density film 5, a compression stress applying film 6, which applies compression stress to the plating film 4 via the low vacancy density film 5 during heat treatment which will be described later, is formed by PVD method, CVD method, electrolytic plating method, electroless plating method or the like for example (Step 7).

A material constituting the compression stress applying film 6 may be, for example, at least one of a metal material such as Al, Ti, or Ni, a metal containing material such as TiN, and an insulating material such as $Si_xN_y$ or SiC. Among them, at least one of Ti, TiN, $Si_xN_y$ and the like is preferable in view of suppressing diffusion into the low vacancy density film 5 and the like and in view of simplicity in film forming in the case where the low vacancy density film 5 and the plating film 4 are each constituted of Cu. Note that the thickness of the compression stress applying film 6 is sufficient as long as it can apply compression stress to the plating film 4.

Whether the compression stress applying film 6 can apply compression stress to the plating film 4 more effectively or not depends not only on the material constituting the compression stress applying film 6, but also on a film forming temperature of the compression stress applying film 6 and a heat treatment temperature thereof, which will be described later. Specifically, when the film forming temperature of the compression stress applying film 6 is lower than the heat treatment temperature, the compression stress applying film 6 expands when it is heat treated. Therefore, in order to apply compression stress effectively to the plating film 4 during the heat treatment, it is necessary to form the compression stress applying film 6 with a material having a smaller linear expansion coefficient than that of the material constituting the plating film 4. Also, when the film forming temperature of the compression stress applying film 6 is higher than the heat treatment temperature, the compression stress applying film 6 shrinks when it is heat treated. Therefore, in order to apply compression stress effectively to the plating film 4 during the heat treatment, it is necessary to form the compression stress applying film 6 with a material having a larger linear expansion coefficient than that of the material constituting the plating film 4. Note that the "linear expansion coefficient" in this embodiment means a linear expansion coefficient at a temperature between room temperature and 300° C.

The compression stress applying film 6 may be a single layer, but it may also be of layered structure constituted of a first film 6A, a second film 6B and so on as shown in FIG. 4. Here, when the compression stress applying film 6 is of layered structure, it is satisfactory if the entire compression stress applying film 6 is capable of applying compression stress to the plating film 4, and thus films constituting the compression stress applying film 6 may include a film that is not capable of applying compression stress to the plating film 4.

Further, when the compression stress applying film 6 is of layered structure, it is preferred to have at least a layer of film having a barrier function for suppressing diffusion of the material constituting the low vacancy density film 5. Specifically, it is preferable that a film (corresponding to the first film 6A in FIG. 4) which directly contacts the low vacancy density film 5 has the barrier function.

Figure 2H:
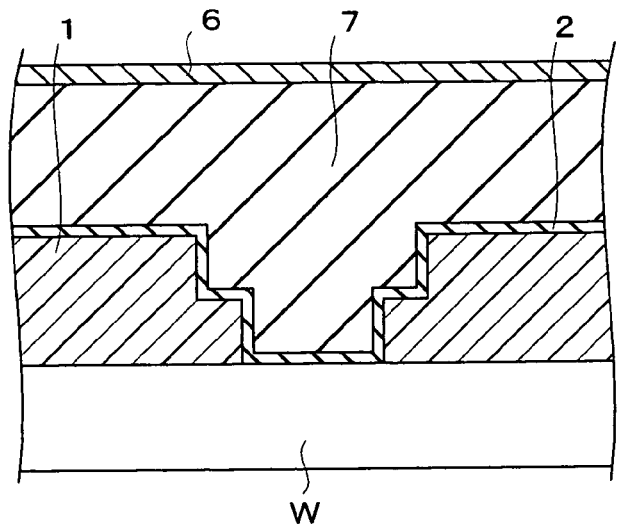

After the compression stress applying film 6 is formed, the plating film 4, the low vacancy density film 5, the compression stress applying film 6, and so on are heat treated (annealed) to glow crystals of the seed film 3 and the plating film 4, thereby forming a wiring film 7 as shown in FIG. 2H (Step 8).

Figure 2I:
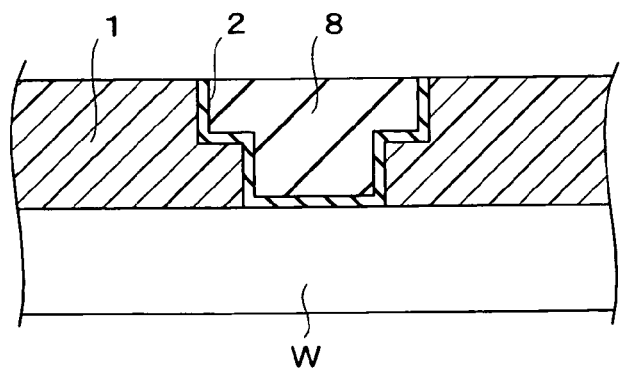

After the wafer W is heat treated, it is polished by chemical mechanical polishing (CMP) for example to remove the compression applying film 6, the low vacancy density film 5, and unnecessary portions of the barrier metal film 2 and the wiring film 7 above the interlayer insulating film 1 respectively so that portions of the barrier metal film 2 and the wiring film 7 existing inside the via hole 1A and the wiring trench 1B remain respectively (Step 9). Specifically, with the wafer W being in contact with a polishing pad (not shown), the wafer W and the polishing pad are rotated while supplying slurry (not shown) to the wafer W, thereby polishing the wiring film 7 and so on. Note that it is not limited to polishing by CMP, and another technique may be used for polishing. Another technique may be, for example, electrolytic polishing. Thus, a wiring 8 having a via plug in the via hole 1A and the wiring trench 1B is formed as shown in FIG. 2I.

In this embodiment, since the plating film 4 and so on are heat treated in a state that the low vacancy density film 5 having lower vacancy density than that of the plating film 4 is formed on the plating film 4, initial voids in the wiring 8 can be reduced and reliability of the wiring 8 can be improved. Specifically, since the vacancy density of the low vacancy density film 5 is lower than that of the plating film 4, performing heat treatment on the plating film 4 in a state that the low vacancy density film 5 is formed thereon causes diffusion of vacancies in the plating film 4 into the low vacancy density film 5 due to density gradient of the vacancies. As a result, the vacancy density in a portion of the plating film 4 filling up the via hole 1A and the wiring trench 1B can be lowered. Thus, voids generated in this portion of the plating film 4 during the heat treatment can be reduced, so that initial voids in the wiring 8 can be reduced. Also, since the vacancy density in the wiring 8 is lowered after the wiring 8 is formed, voids are not generated easily even if stress concentrates. Thus, reliability of the wiring 8 can be improved.

In this embodiment, since the plating film 4 and so on are heat treated in a state that the compression stress applying film 6 which applies compression stress to the plating film 4 is formed on the low vacancy density film 5, initial voids in the wiring 8 can be further reduced and reliability of the wiring 8 can be further improved. Specifically, when the heat treatment is performed in a state that the compression stress applying film 6 is formed on the low vacancy density film 5, compression stress is applied to the plating film 4 via the low vacancy density film 5 by means of operation of the compression stress applying film 6, so that vacancies in the portion of the plating film 4 filling up the via hole 1A and the wiring trench 1B can be pushed toward an upper portion of the plating film 4. As a result, vacancy density in the portion of the plating film 4 filling up the via hole 1A and the wiring trench 1B can be lowered. Thus, initial voids in the wiring 8 can be further reduced, and reliability of the wiring 8 can be further improved.

It should be noted that the present invention is not limited to the contents of description of the above embodiment, and thus the structure, material, arrangement of respective members and so on may be appropriately changed without departing from the spirits of the present invention.

What is claimed is:

1. A method of manufacturing a semiconductor device, comprising:
    forming on a semiconductor substrate an insulating film having a recessed portion in a surface thereof, the recessed portion forming a space over the semiconductor substrate;
    forming a barrier film on an inside face of the recessed portion and on the insulating film;
    forming a seed film on the barrier film;
    forming a first metal film on the seed film so as to fill up the space formed by the recessed portion;
    forming on the first metal film a second metal film having lower vacancy density than that of the first metal film;
    forming on the second metal film a compression stress applying film which applies compression stress to the first metal film through the second metal film when heat treatment is applied;
    performing heat treatment on the first metal film, the second metal film and the compression stress applying film; and
    removing the second metal film and the first metal film except a portion thereof filling up the recessed portion to thereby form a wiring in the recessed portion.

2. The method of forming the semiconductor device as set forth in claim 1, wherein the second metal film is constituted of the same metal as metal constituting the first metal film.

3. The method of forming the semiconductor device as set forth in claim 1,
    wherein, when a linear expansion coefficient of a material constituting the compression stress applying film is smaller than a linear expansion coefficient of a material constituting the first metal film, the compression stress applying film is formed at a temperature lower than a temperature of the heat treatment, and
    wherein when a linear expansion coefficient of a material constituting the compression stress applying film is larger than a linear expansion coefficient of a material constituting the first metal film, the compression stress applying film is formed at a temperature higher than a temperature of the heat treatment.

4. The method of forming the semiconductor device as set forth in claim 1, wherein the compression stress applying film comprises a film having a barrier function which suppresses diffusion of metal constituting the second metal film.

5. The method of forming the semiconductor device as set forth in claim 1, wherein the first metal film is made of any one of Cu, Ag and Au.

6. The method of forming the semiconductor device as set forth in claim 1, wherein the forming of the second metal film is performed by Physical Vapor Deposition method.

7. The method of forming the semiconductor device as set forth in claim 2, wherein the first metal film and the second metal film are made of Cu.

8. The method of forming the semiconductor device as set forth in claim 1, wherein the forming of the second metal film is performed to form the second metal film as a layered structure.

9. The method of forming the semiconductor device as set forth in claim 1, wherein the compression stress applying film is made of any one of a metal material, a metal containing material and an insulating material.

10. The method of forming the semiconductor device as set forth in claim 1, wherein the compression stress applying film is made of at least any one of Ti, TiN and $Si_xN_y$.

11. The method of forming the semiconductor device as set forth in claim 1, wherein the forming of the compression stress applying film is performed to form the compression stress applying film as a layered structure.

12. The method of forming the semiconductor device as set forth in claim 11, wherein the compression stress applying film formed as the layered structure comprises a film having a function for suppressing diffusion of a material constituting the second metal film.

13. The method of forming the semiconductor device as set forth in claim 12, wherein the film having the function for suppressing diffusion of the material constituting the second metal film directly contacts the second metal film.

* * * * *